United States Patent [19]

Wiercienski et al.

[11] Patent Number: 5,255,948
[45] Date of Patent: Oct. 26, 1993

[54] DEVICE FOR USE IN POSITIONING AN ARTICLE PRECISELY IN A DESIRED LOCATION

[75] Inventors: Jacek Wiercienski, Oakville; Pawel Kuzan, Toronto; Krzysztof F. Szymczyk, Toronto; Andrew A. Goldenberg, Toronto; Bruce L. Godkin, Walton all of Canada

[73] Assignee: Northern Telecom Limited, Montreal, Canada

[21] Appl. No.: 774,506

[22] Filed: Oct. 10, 1991

[51] Int. Cl.$^5$ ............................................. B66F 11/00
[52] U.S. Cl. .............................. 294/86.41; 294/103.1; 414/744.8; 901/39
[58] Field of Search ................. 294/86.4, 86.41, 103.1, 294/119.1; 414/744.8, 783; 901/39

[56] References Cited

U.S. PATENT DOCUMENTS 3,824,674  7/1974  Inoyama et al. ................. 29/407

Primary Examiner—Michael S. Huppert
Assistant Examiner—Janice Krizek
Attorney, Agent, or Firm—R. J. Austin

[57] ABSTRACT

A device for use in placing surface mount components upon PCBs having article gripping elements carried by a support. The article gripping elements are movable between an upper position and a lower position for engaging and gripping surface mount components. The article gripping elements are dependent from a vertical flexible shaft so that the elements may become inclined upon contacting with a surface mount component so that a correct engagement and gripping action takes place. A seat is provided upon the support to ensure correct orientation of the elements upon their return to the upper position.

15 Claims, 10 Drawing Sheets

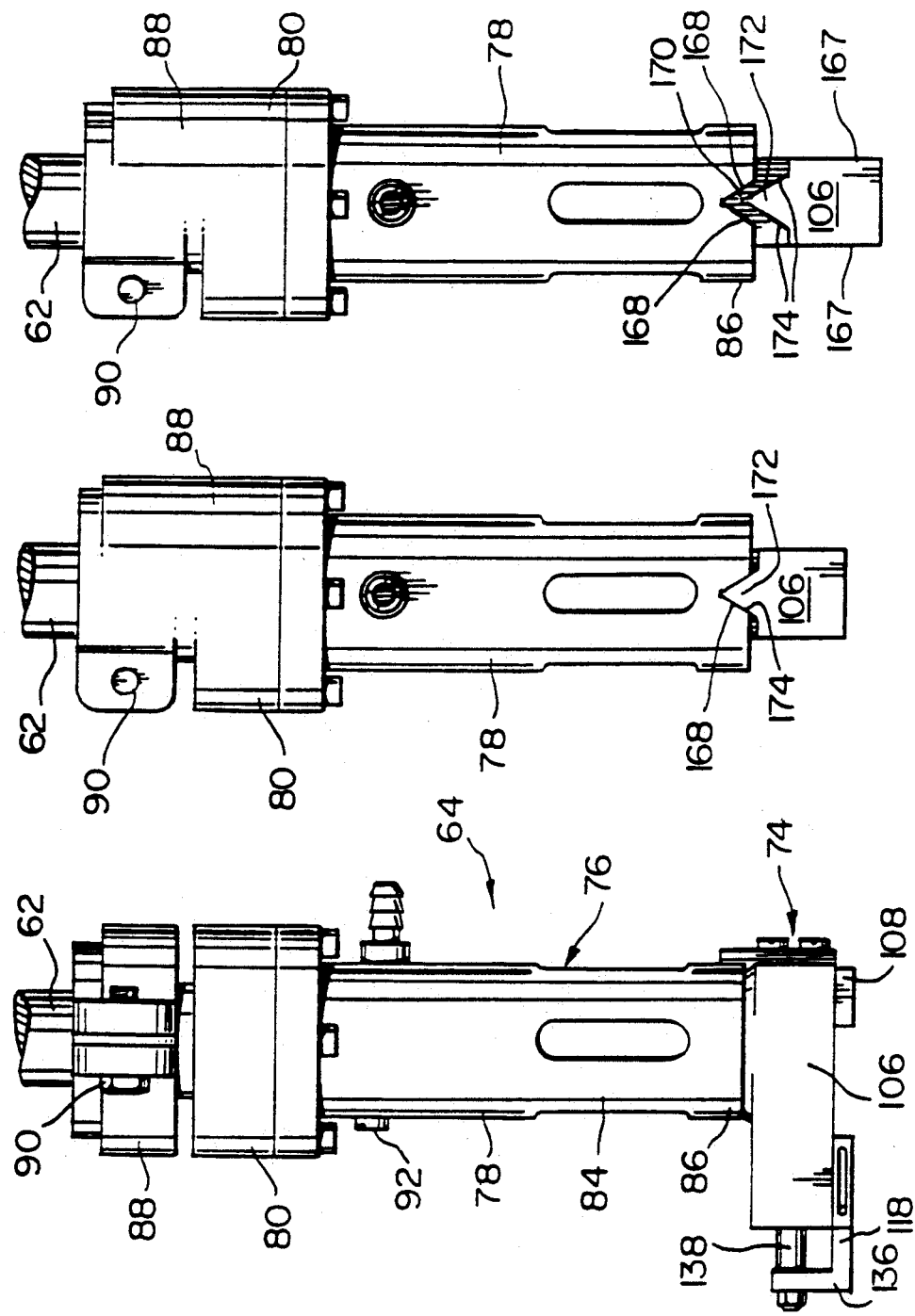

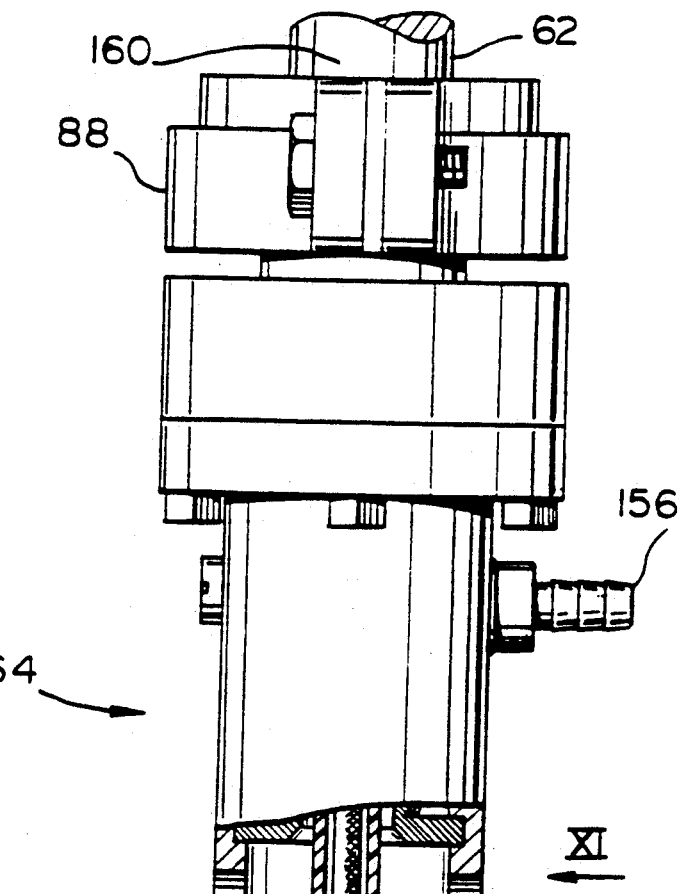
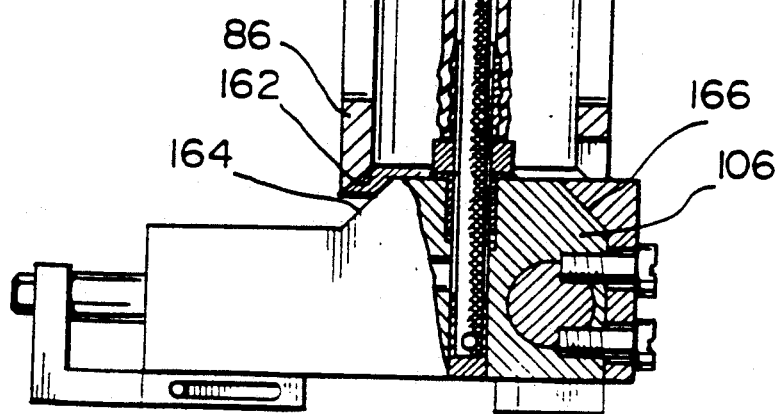
FIG. 9

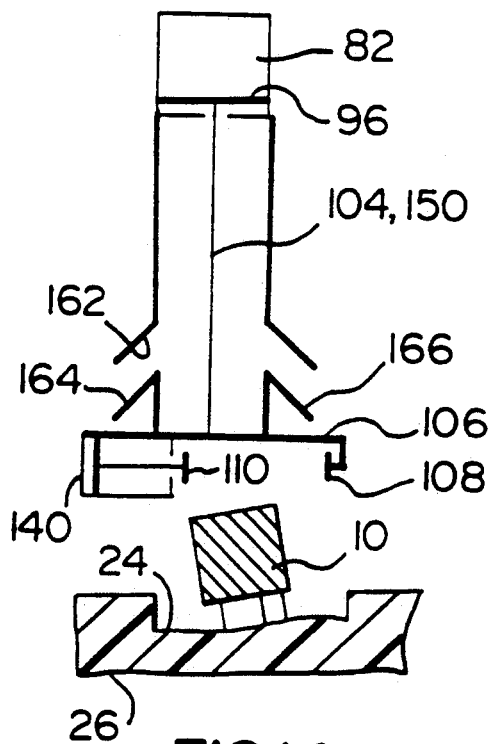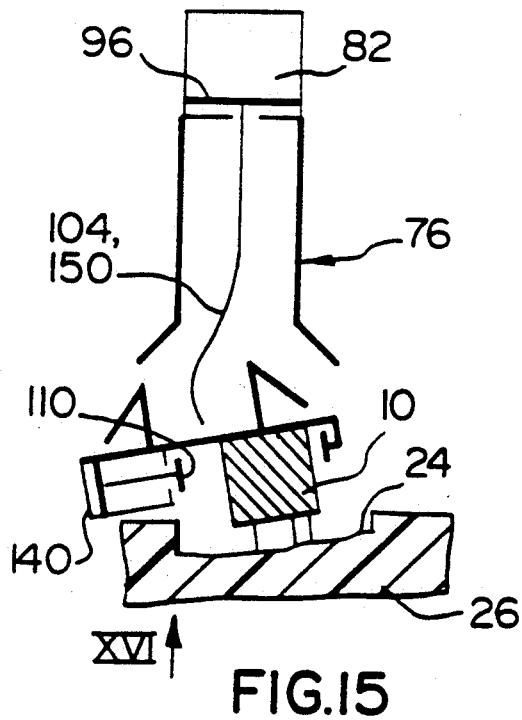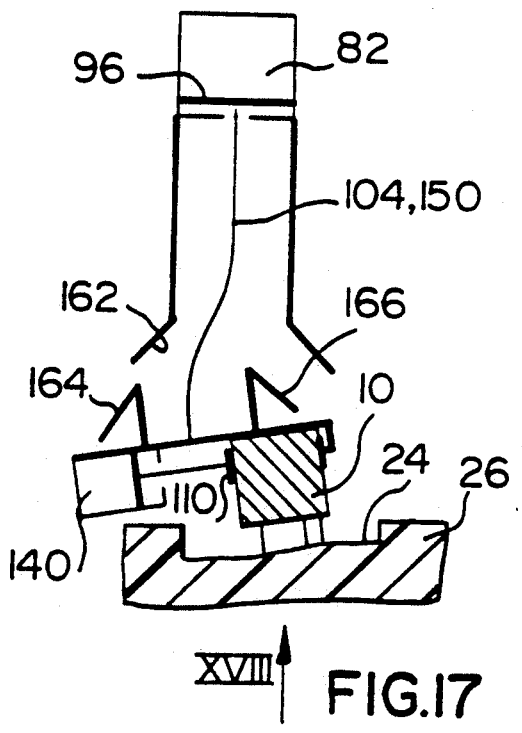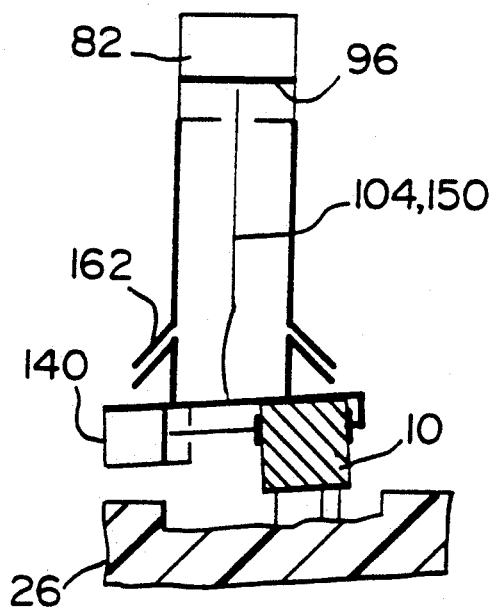

DEVICE FOR USE IN POSITIONING AN ARTICLE PRECISELY IN A DESIRED LOCATION

This invention relates to devices for use in positioning articles precisely in a desired location.

Devices are known for positioning articles precisely in desired locations and positions of orientation. In the electronics field, such devices are used for transporting electronic components from pick-up stations to locate them accurately in desired positions upon printed circuit boards with terminal pins of the components located in holes in the boards. For this purpose, a device provides a robot arm having a free end carrying a transporting gripper normally referred to as a "gripper." The robot arm is operated under a programmed computer control to cause the arm to move in a sequence of operations together with programmed control in orientation of the gripper to deal with the components so as to assemble them accurately into individual desired positions on the board. Alternatively, a plurality of robot arms carrying grippers are used, each for mounting an individual component upon a board, the board being moved along a conveyor intermittently from one component station to another.

In one known method of transporting and assembling components onto a printed circuit board, the components are fed in succession along a feed chute to a pick-up station. To assemble each component into its desired location on the board, the robot arm is pivoted to locate the gripper directly above the pick-up station and the gripper is then lowered to grip the component. The gripper holding the component is raised and the arm is pivotally moved to position the gripper above an assembly station for that component on the board, the gripper then being lowered to locate the component in position on the board with the component pins passing through holes in the board. The gripper is then removed from the component and the board. In this method, the position and orientation of each component in the pick-up station is accurately controlled by the chute in a horizontal plane and, as the gripper is also accurately positioned and oriented by computer operation above the pick-up station, then each component upon being held by the gripper is immediately in a desired location and position of orientation relative to the gripper to enable the component to be precisely located upon the board. While this method of assembly is effective, the cost of the operation is inordinately increased by the initial outlay required for the provision of the chute and associated machine parts, such as tube feeders for feeding the components to the chute. The cost is also increased because of maintenance requirements upon the chute and its associated machine parts to ensure that the components continue to be correctly fed along the chute and into their desired locations and positions of orientation in the pick-up station. Further, maintenance time required for the chute and associated machine parts results in reduced commercial use of the whole apparatus and thus detracts from the efficiency of the process.

In another known method, the components are initially disposed relatively loosely in individual open-topped compartments of a carrying tray with each component disposed possibly slightly out of its desired location and position of orientation in a horizontal plane. Each component is thus located somewhat haphazardly in its own individual pick-up station. A robot arm must be computer controlled to dispose its gripper sequentially and in required order above the pick-up stations to transport the components to their individual assembly stations on a printed circuit board or boards. However, as the components are not located precisely in their desired locations and positions of orientation in the tray, upon being held by the gripper, each component is not located to enable it to be accurately assembled in its desired location and position of orientation upon the printed circuit board. It is thus necessary in this method for the gripper to carry each component from the carrying tray to a position and orientation correction jig into which each component is deposited. Jaws of the jig disposed on each side of the component then move towards each other to engage and move the component horizontally into a desired location and position of orientation so that when the gripper once again descends to grip and raise the component a second time, the component is in a desired location and position of orientation relative to the gripper for the component to be precisely located upon the printed circuit board. Again, while this method of assembly is effective, the correction jig adds to the cost of the apparatus and increases the complexity of operation of the robot arm and gripper. Furthermore, as in the previously referred to prior method, maintenance time is required to ensure that the correction jig continues to operate to dispose successive surface mount components in their desired locations and positions of orientation. Maintenance time to ensure correct operation of the jig results in reduced commercial use of the apparatus as previously referred to.

Furthermore, in each of the above methods unless each component is correctly oriented with regard to a horizontal axis with an upper surface substantially horizontal then it may be extremely difficult, if not impossible, for the gripper to correctly engage and then grip the component.

The present invention seeks to provide a device for use in positioning an article precisely in a desired location and position of orientation and which in use does not require the use of a chute and associated machine parts nor a position and orientation correction jig.

According to the present invention there is provided a device for use in positioning an article precisely in a desired location and position of orientation comprising: an article gripping means and a support for the gripping means, the article gripping means dependent from a flexible shaft means of the support; the article gripping means having at least two gripping jaws and being movable between an upper position close to the support and a lower position spaced from the support and in which the flexible shaft is flexible in any desired direction to tilt the article gripping means to enable the article gripping means to engage and then to become inclined according to the inclination of the upper surface of the article so as to enable the jaws during closing to correctly engage the article before raising it; and seating means for seating the article gripping means in a desired location and position of orientation relative to a vertical axis of the support upon return of the article gripping means into its upper position whereby the gripping jaws when gripping the article are disposed in desired locations and positions of orientation relative to the vertical axis.

Thus with the use of the device according to the invention as defined above, if the article is initially incorrectly oriented and has an inclined upper surface, then the article gripping means will become inclined in a desired manner and the jaws will then grip the article.

The weight of the gripping means as it returns to the upper position will cause the flexible shaft means to move towards an unflexed condition and the seating means will then correctly seat the article gripping means.

Preferably, in a device according to the invention, the article gripping means is free to be angularly oriented relative to the vertical axis and the device comprises an angle orientation correction means for effecting change in angle of orientation of the gripping means after it has moved out of the lower position whereby, with the gripping means seated, gripping jaws when gripping the article are disposed in desired locations and position of orientation relative to the vertical axis. This arrangement is effective to grip the article if it is also incorrectly positioned about a vertical axis. As the jaws engage the article during closing and continue to close, the article gripping means is caused to pivot about the vertical axis because of the engagement, until the jaws are correctly located relative to the article so as to grip it. Thus, when the gripping jaws are changed in their angular orientation upon return into the upper position then the article itself becomes accurately positioned in the device about the vertical axis.

It follows therefore that with the preferred arrangement of the invention, the article may be tilted away from a desired position and may also be incorrectly positioned about a vertical axis before being gripped by the jaws and the device will still ensure that the article is positioned correctly in the device when the article gripping means is returned to its seat. As a result, the device requires no external assistance for correctly positioning the article.

It is also preferable that in the device the article gripping means is provided with a fluid operated piston and cylinder arrangement for relatively moving the jaws. With this structure the flexible shaft means comprises a flexible shaft surrounded by a flexible sleeve to define an annular passage between shaft and sleeve, the passage interconnected with the cylinder of the arrangement for flow of fluid to control the operation of the piston. In a practical arrangement the support has a vertically disposed piston and cylinder assembly and the shaft extends between the piston and the article gripping means with the annular passage interconnected with a further passage through the piston for connection to a source of pressurized fluid.

Preferably the orientation correction means is in the form of a pair of opposed and convergent registration surfaces provided upon the support and a further pair of such surfaces provided upon the article gripping means. The registration surfaces are inclined relative to the vertical axis in each pair and, with the registration surface of one pair slidable upon a corresponding surface of the other pair as the article gripping means is being moved into the upper position, change in orientation of the gripping means is effected about the vertical axis and the gripping jaws are located in their desired locations and positions of orientation. In a preferred arrangement, one of the pairs of registration surfaces is provided upon a projection forming part of the article gripping means, the projection being receivable within a recess of the support, surfaces of the recess providing the other pair of registration surfaces.

The article gripping jaws may be of any desired configuration and may be pivotally mounted or not pivotally mounted as required.

One embodiment of the invention will now be described, by way of example, with reference to the accompanying drawings, in which:

FIG. 6 is a side elevational view of the device of the embodiment and to a much larger scale than shown in FIG. 4;

FIG. 8 is a view on the direction of arrow VIII in FIG. 7 of the device;

FIGS. 9 and 10 are views similar to FIG. 7, but with FIG. 9 only partly in section, and showing parts of the device in different positions;

FIG. 11 is a side elevational view in the direction of arrow XI in FIG. 9;

FIGS. 14 and 15 are diagrammatic cross-sectional views similar to FIG. 7 and showing two different stages in the use of the device;

FIG. 17 is a view similar to FIGS. 14 and 15 of a further stage in the use of the device;

FIGS. 20, 21 and 22 are views similar to FIGS. 14 and 15 of yet three further stages in the use of the device.

Figure 1:
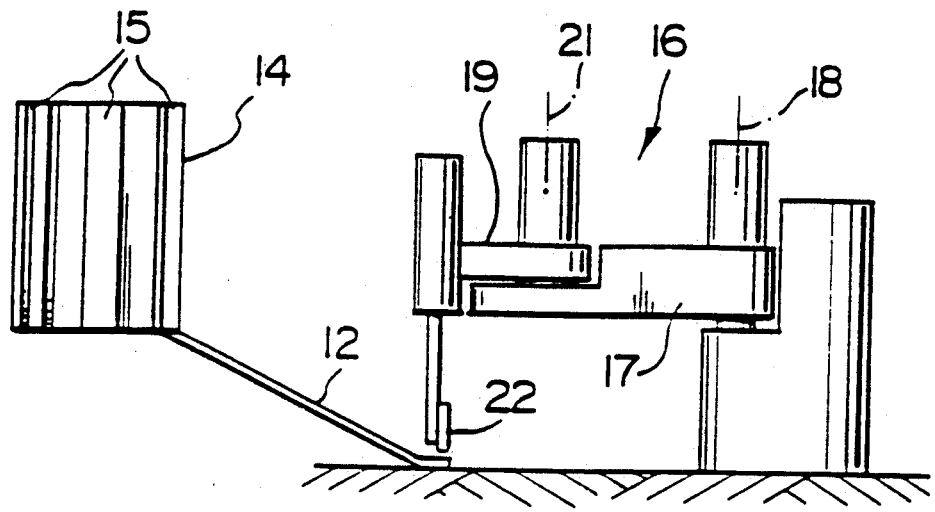
FIG. 1 is a diagrammatic side elevational view of a prior apparatus for transferring electronic components into a printed circuit board.
Figure 2:
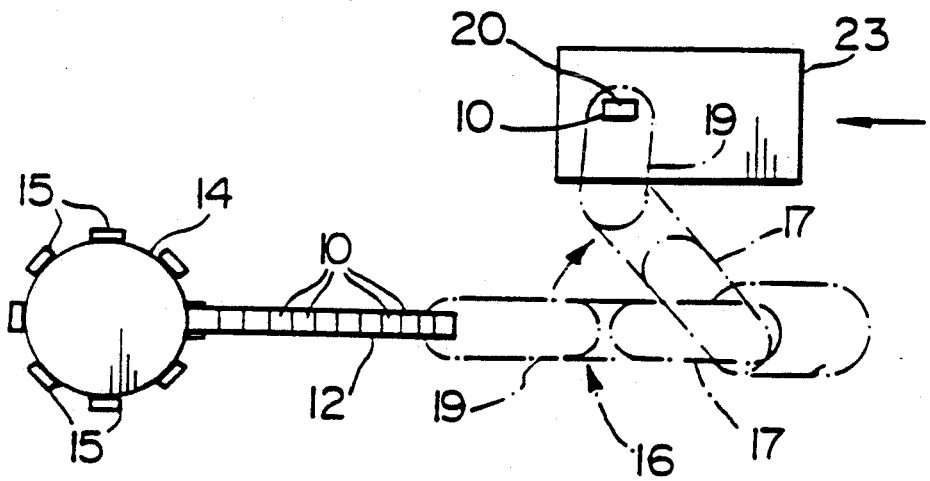
FIG. 2 is a plan view of the prior apparatus of FIG. 1.

In one prior method of transporting and assembling electronic components having terminal pins onto a printed circuit board, the electronic components 10 are fed in succession down a chute 12 as shown in FIGS. 1 and 2, from a rotatable tube feeder 14 having vertical stacks 15 of the components 10. An articulated robot arm 16 having a main arm section 17 pivotally mounted about a vertical axis 18 and another arm section 19, pivoted upon section 17 about vertical axis 21 is employed to transport each of the components 10 from the lower end of the chute 12 and position it accurately in an assembly station 20 on an individual printed circuit board 23 which is accurately located in position for this purpose. The boards are moved in succession along a conveyor (not shown) to receive their components 10. Alternatively, two or more components are fed in succession into different assembly stations on each board. Movement of the robot arm and of a gripper 22 for holding the components 10 at the free end of the arm is computer controlled. The gripper 22 is lowered over a pick-up station at the end of the chute 12 to grip a component 10 and transport it to a particular station 20 on the printed circuit board and then return to grip the succeeding component 10 which now lies in the pick-up station. As shown by FIG. 2, in which the robot arm 16, in its various positions, is indicated by a chain-dotted outline, the robot arm is indicated as moving between the pick-up station at the chute and an assembly station 20. The chute 12 is accurately designed so that upon reaching the lower end of the chute, i.e. at the pick-up station, each component is disposed accurately in a desired location and a position of orientation with regard to x and y coordinates in the computer memory so that as the gripper 22 grips the component 10, the component and gripper are precisely located relative to each other also in desired locations and positions of orientation. Hence, under computer control, the gripper may transport each component and accurately position it in its assembly station 20 upon its printed circuit board. When assembled, terminal pins of the components extend into terminal pin receiving holes in the board.

The above method of assembly of components 10 onto printed circuit boards is extremely effective. However, the initial cost for the chute 12 and the associated tube feeder 14 adds undesirably to the total cost of the apparatus. Also, care must be taken to ensure that, on a continuous basis, each of the components 10 is disposed accurately in position with regard to the x and y coordinates when in the pick-up station. Otherwise, problems arise in accurately locating the components 10 upon their printed circuit boards. Hence, maintenance and cleaning of the chute and tube feeder is a continual essential requirement to ensure that the total apparatus operates effectively. The time required for maintenance procedures is extremely inconvenient and reduces significantly the time available for commercial use of the apparatus.

Figure 3:
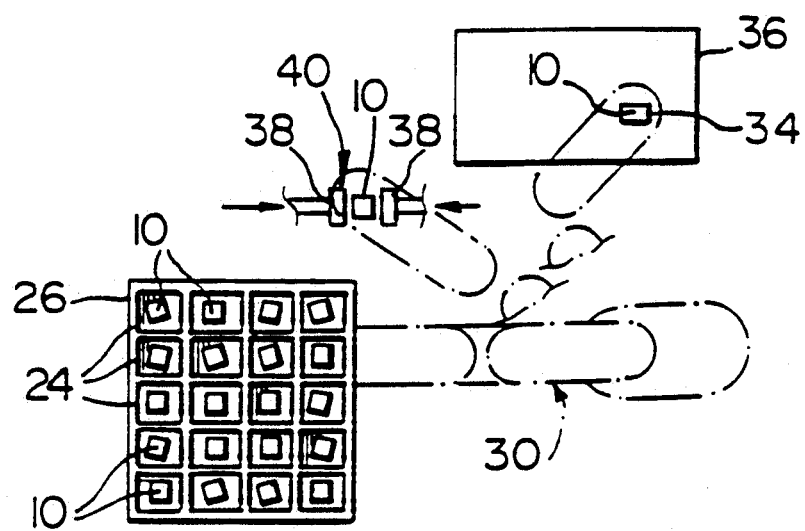
FIG. 3 is a diagrammatic plan view of another prior apparatus for transferring electronic components into a printed circuit board.

In a second known process as shown in FIG. 3, the use of the chute and associated tube feeder is avoided. In this process, components 10 are loaded individually into open topped compartments 24 formed in an inexpensive carrying tray 26 which may, for instance, be formed from molded foamed plastics material. A robot arm 30 (chain-dotted outline) having a gripper (not shown) is used for transporting the components sequentially from their pick-up stations (i.e. compartments 24) to their individual assembly stations 34 in a succession of printed circuit boards 36. In this particular process, the components 10 are not required to be accurately positioned with regard to the x and y coordinates of the computer as with the previously described method. In contrast, the components 10 are positioned loosely within the compartments 24 and may be slightly offset from desired locations and positions of orientation when being gripped and held by the gripper. Hence, each component 10 is not accurately disposed with regard to the gripper for positioning immediately in its particular assembly station 34 upon a printed circuit board 36. Thus, it is necessary for each of the components 10 to be correctly orientated and positioned after removal from the tray 26 and for this particular purpose, the robot arm moves to cause the gripper to deposit the component in spaced apart jaws 38 of a position setting device 40.

This operation complicates the arm and gripper movement in that for each component 10 the gripper is lowered to grip the component in the tray, the gripper then being raised prior to pivoting of the robot arm to enable the gripper to be lowered once more to deposit the component between the jaws 38 of the device 40. After the jaws 38 have been moved together to engage sides of the component and locate it and orientate it correctly with regard to the x and y coordinates within the computer, the gripper is again lowered to retrieve the component 10, is then raised and is moved by the robot arm to the assembly station 34 of the printed circuit board. Further to this, the device 40 is an inordinately expensive item and requires continual maintenance and cleaning to ensure that it operates correctly. As with the previously described prior method, this maintenance procedure detracts from the time available for commercial use of the whole apparatus.

The present invention as outlined below with regard to the embodiment to be described overcomes the problems associated with prior apparatus.

Figure 5:
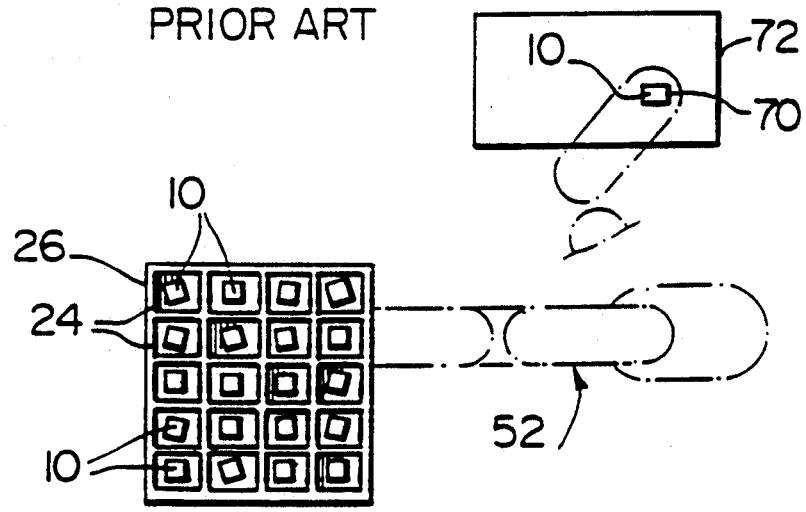
FIG. 5 is a plan view of the apparatus shown in FIG. 4 but to a smaller scale and incorporating the device of the first embodiment.
Figure 4:
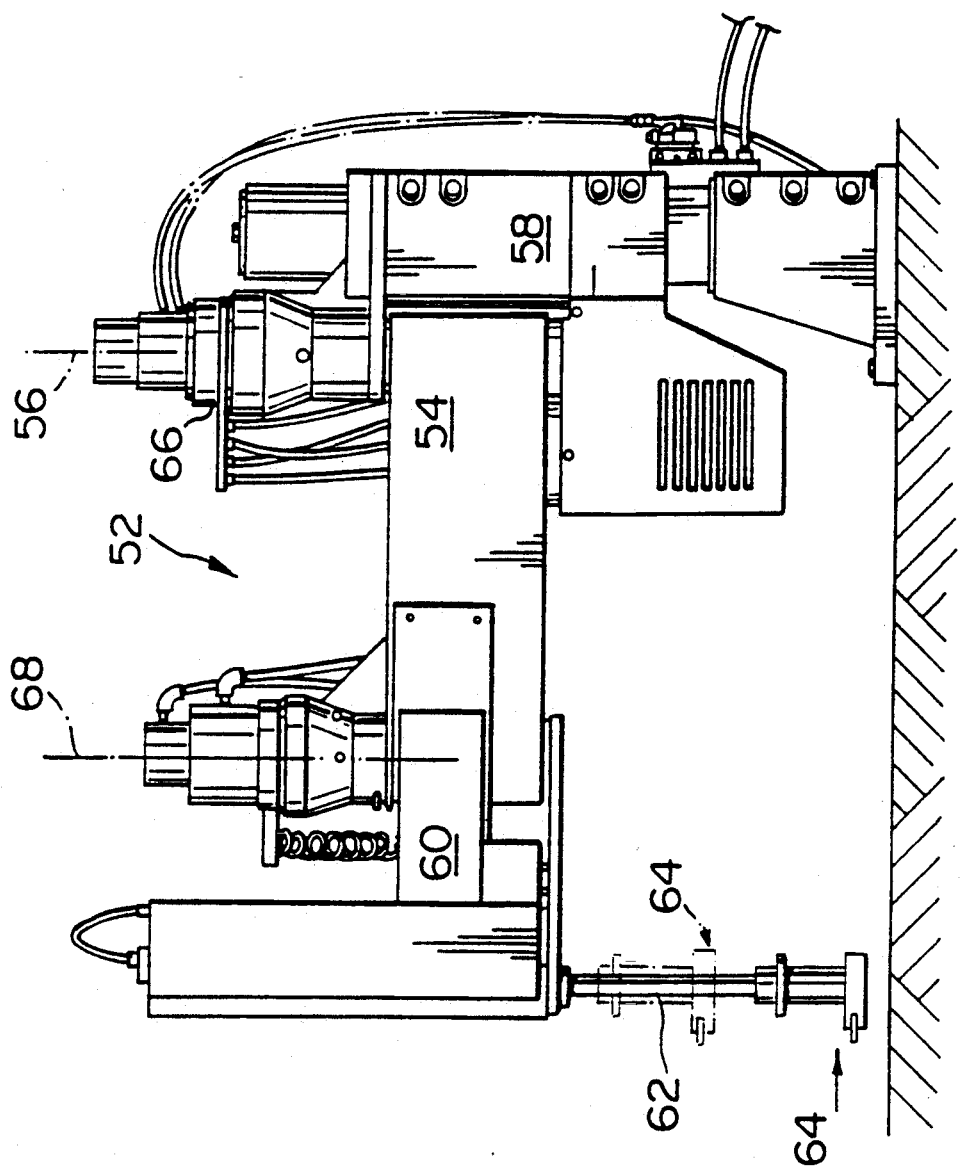
FIG. 4 is a side elevational view of an apparatus for transferring components into a printed circuit board, the apparatus including a device according to the embodiment.

FIG. 4 is a general side elevation of an apparatus according to the embodiment for transporting components 10 from pick-up stations and depositing them accurately upon a printed circuit board. As shown by FIG. 4, the apparatus comprises an articulated cantilever robot arm 52, of similar structure to that of robot arm 16, and comprising a main arm section 54 pivotally movable by motor 66 about a vertical axis 56 to a stand 58, and a further arm section 60 which is pivotally movable by motor 68 at a free end of the arm section 54. The arm 60 has at its remote end a vertically movable vertical spindle 62, and a device in the form of a gripper 64 depends from a lower free end of the spindle 62. The gripper 64, as will be seen from the following description, is capable itself of locating each component 10 in a desired location and position of orientation and then of assembling it correctly onto a printed circuit board. As shown by FIG. 5, the gripper 64 is used for transporting components 10 substantially loosely contained within compartments 24 of a tray 26 similar to that in FIG. 3, and for locating each of them accurately in an assembly station 70 of an individual printed circuit board 72 without it being necessary for the device 64 to release the components for position and orientation correction prior to assembly onto a board. This is clear from a comparison of FIGS. 3 and 5.

Figure 7:
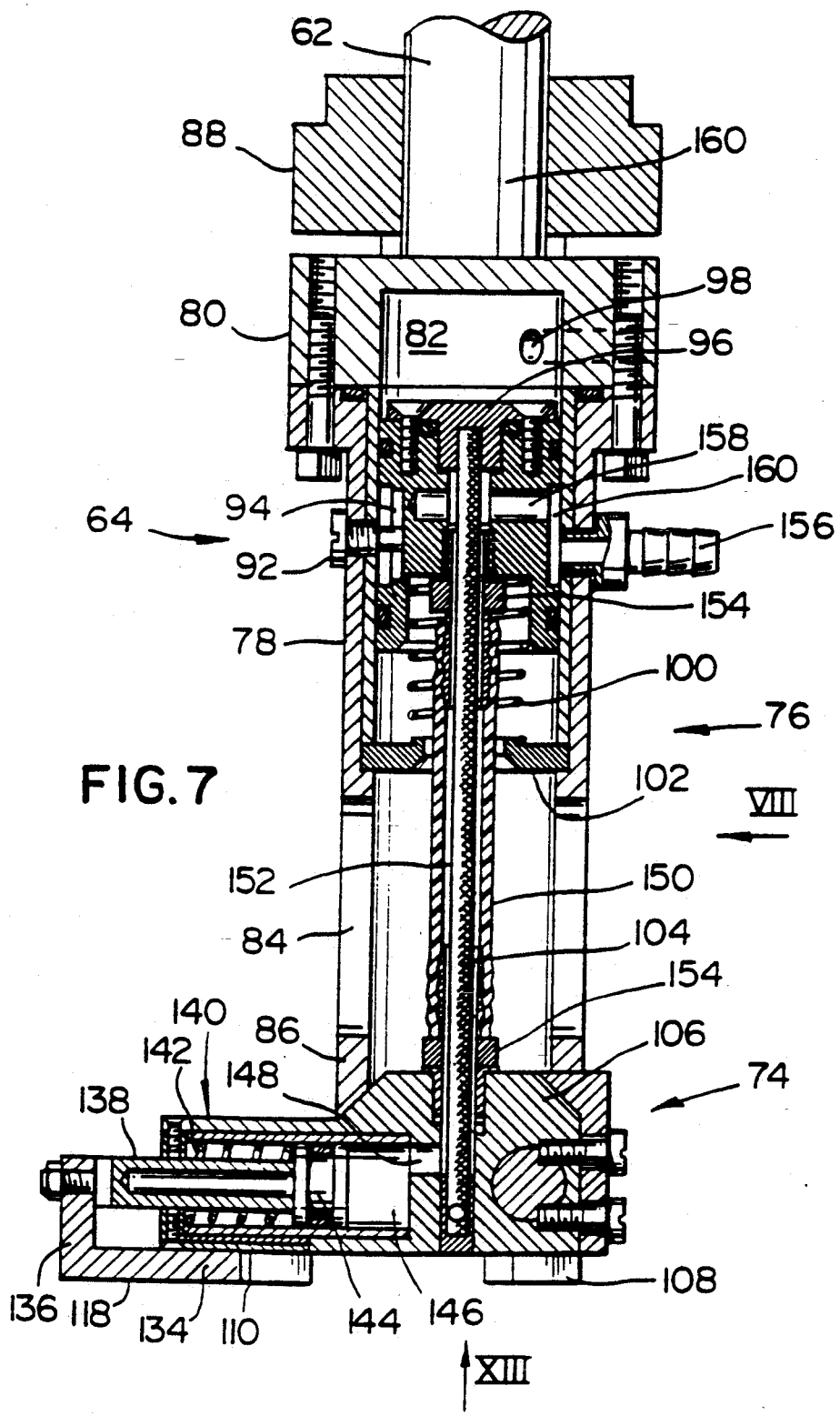
FIG. 7 is a cross-sectional view of the device in the same elevation as in FIG. 6.

As shown in FIGS. 6 and 7 which are to a larger scale than FIG. 4, the gripper 64 comprises an article gripping means shown generally at 74 and a support carrying the article gripping means and shown generally at 76. The support 76 comprises a fluid operated (i.e. a pneumatically operated) piston and cylinder assembly comprising a cylinder 78 having a cap 80 to close the upper end of a chamber 82 defined by the cylinder. The cylinder 78 depends beyond the chamber 82 as a cylindrical extension 84 having a lower end 86. The end cap 80 extends upwardly as a radially split end portion 88 which accommodates the lower end of the vertical spindle 62 and is radially split to be forced inwardly against the spindle for holding purposes by a holding bolt 90 (see FIGS. 6, 8 and 11). A key 92 extends through the wall of the cylinder 78 to be received in a channel 94 of the piston 96 received within the chamber 82 so as to prevent rotation of the piston within the chamber. An upper end of the chamber 82 is connected through a port 98 extending through the cap 80 to air under pressure or to ambient atmosphere for the operation of the piston 96. Upward movement of the piston once pressurized air is removed from the chamber is created by a compression spring 100 disposed beneath the piston and operating against an end plate 102 of the piston and cylinder assembly.

The article gripping means 74 is connected to the piston 96 by a flexible shaft 104 in the form of a flexible cable which is coaxially secured to the piston 96 at an upper end of the shaft 104. The article gripping means 74 comprises a metal block 106 and the flexible shaft 104 extends into the block and is secured in the lower regions of the block.

Figure 13:
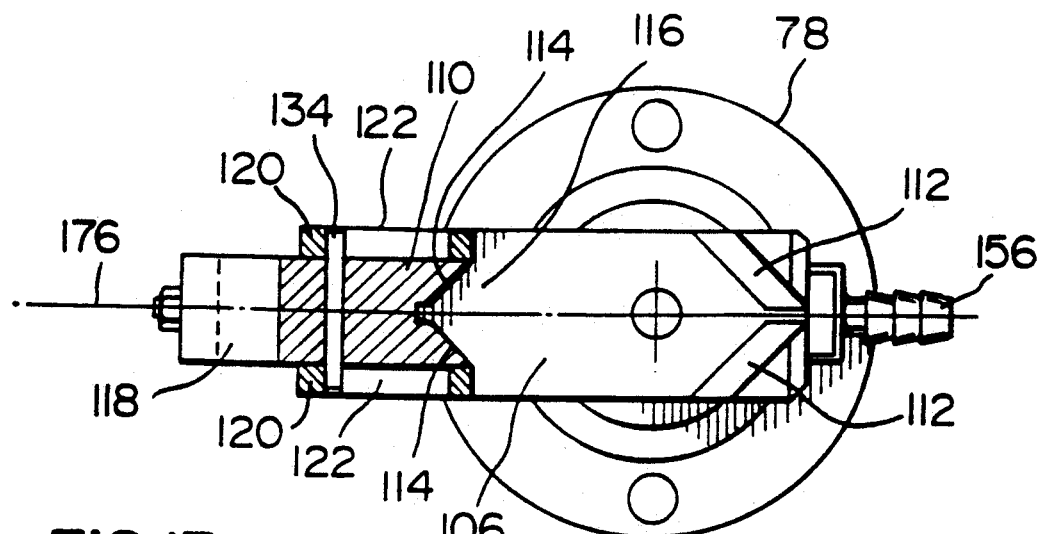
FIG. 13 is a view partly in section, in the direction of arrow XIII in FIG. 7 of the device.

On the underside of the metal block 106 are provided two gripping jaws 108 and 110. As shown particularly by FIG. 13, the gripping jaws 108 comprise two parts 112 which are elongate and extend substantially at 90° to each other, the parts 112 being fixed to one end of the block 106 with the 90° angle facing towards the other end of the block. The other gripping jaw 110 is provided with two sides 114 of a right-angled notch 116 formed at one end of a plate 118 which is slidably guided between guides 120 on the undersurface of the metal block 106. The guides 120 are each formed with a recess 122 and a guide peg 134 received through the plate 118 extends into the recesses 122 for guide purposes. At an outer end, the plate 118 extends upwardly as an extension 136 (FIG. 7), the upper end of which is secured to a piston rod 138 of a piston and cylinder arrangement 140 provided to relatively move the jaws by movement of the jaw 110. The piston and cylinder arrangement 140 is operated by pneumatic pressure with a return spring 142 acting upon the piston 144. Pressurized air is admitted to one end of the chamber 146 through an inlet port 148, connected to a passageway 152 surrounding the shaft 104 and defined within a flexible plastic sleeve 150 which is sealingly secured into adaptors 154, mounted one upon the metal block 106 and the other upon the underside of the piston 96. The passageway 152 communicates with an inlet port provided by adaptor 156 extending through the cylinder 78, by a radial passage 158 and an annular passage 160 in the piston 96. The annular passage 160 is of sufficient axial length to maintain interconnection with the adaptor 156 for any axial position of the piston 96.

Figure 12:
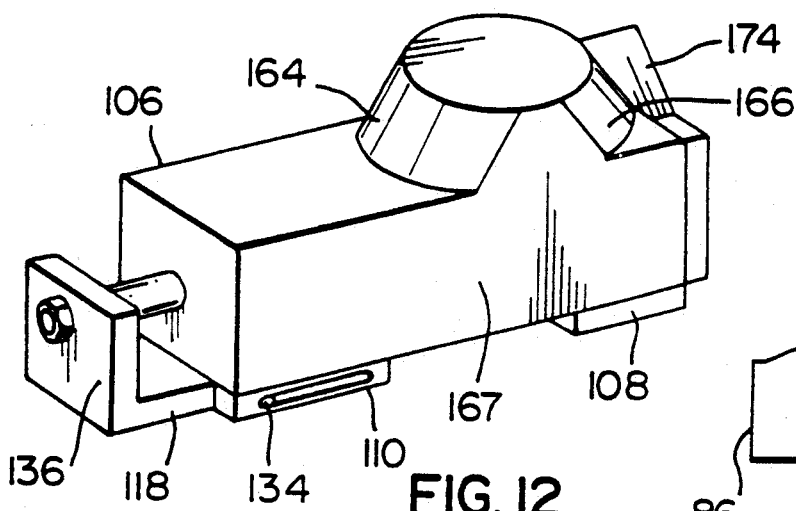
FIG. 12 is an isometric view of part of the device of the embodiment.

From the above, it is clear that vertical movement of the piston 96 is accompanied by vertical movement of the metal block 106. With the piston 96 in an upper position as shown in FIG. 7, then the metal block 106 is in its upper position with a top surface of the block in contact with the lower end 86 of the extension 84. Seating means is provided between the lower end of the extension 84 and the metal block 106. To ensure that the metal block and thus the jaws 108 and 110 are all disposed in desired locations and positions of orientation relative to the vertical axis 160 of the cylinder 78 in this upper position, the seating means comprises an arcuate surface at the lower end 86 of the cylinder. This arcuate surface, as shown in FIG. 9, particularly, is a frustoconical surface 162 which tapers upwardly into the lower end 86. Upon the metal block 106 the seating means also comprises two arcuate surfaces 164 and 166 (see particularly FIG. 12), the surfaces 164 and 166 being two parts of a frustro-conical surface which has been separated into the two parts by flat sides 167 of the metal block 106. These two parts 164 and 166 of the frusto-conical surface are complementary to the surface 162. The surface 162 coacts with surfaces 164 and 166 as will be described, during movement of the block 106 into its upper position so as to position the block with the lower end of the flexible shaft 104 coaxial with the piston 96.

Figure 19:
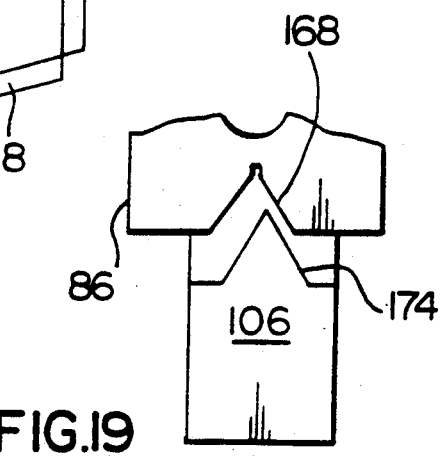
FIG. 19 is a view on arrow XIX in FIG. 18.

The seating means also comprises a pair of opposed registration surfaces formed at the lower end 86 of the cylinder 78 and a pair of complementary registration surfaces provided upon the article gripping means 74. With regard to the cylinder 78, the registration surfaces are provided by two opposing surfaces 168 of a tapered recess 170 formed upwardly into the lower end 86 of the cylinder (FIGS. 8, 11 and 19). The registration surfaces of the article gripping means are provided by an upwards projection 172 of the gripping means, the projection having oppositely inclined surfaces 174 which, in the upper position of the article gripping means as shown by FIG. 8, register exactly with the surfaces 168.

As may be seen, these registration surfaces 168 and 174 are spaced radially from the axis of the flexible shaft so as to provide a turning force upon the article gripping means, for a reason to be described. The recess 170 as it is formed at the lower end 86 of the cylinder 78 provides a circumferential interruption in the arcuate surface 162.

In use, and as already indicated with reference to FIG. 5, the arm 52, under computer control, is movable in a relatively simple manner to remove the components 10 in sequence from their compartments 24 in the tray 26 and deposit them directly by a single swinging movement of the robot arm into their individual assembly stations 70 in a succession of printed circuit boards 72. This is notwithstanding that any or each of the components 10 may be displaced from its desired x and y coordinates and may also be angularly displaced from its desired position of orientation by up to an angle of 20°. Thus, as will be seen, the device 64 of this embodiment is capable of correcting the position of each component 10 where there is an error of up to 20° in the angle of orientation. In any particular case the limiting angle for positional error of a component 10 which may be corrected is dependent upon the actual design of a particular embodiment of the invention and it should be understood that the invention is not limited to the quoted angle of 20°. Further to this, the device 64 is capable of gripping a component 10 which is incorrectly oriented with regard to a horizontal axis and then correcting the angle of orientation upon the article gripping means reaching its upper position.

Figure 10:
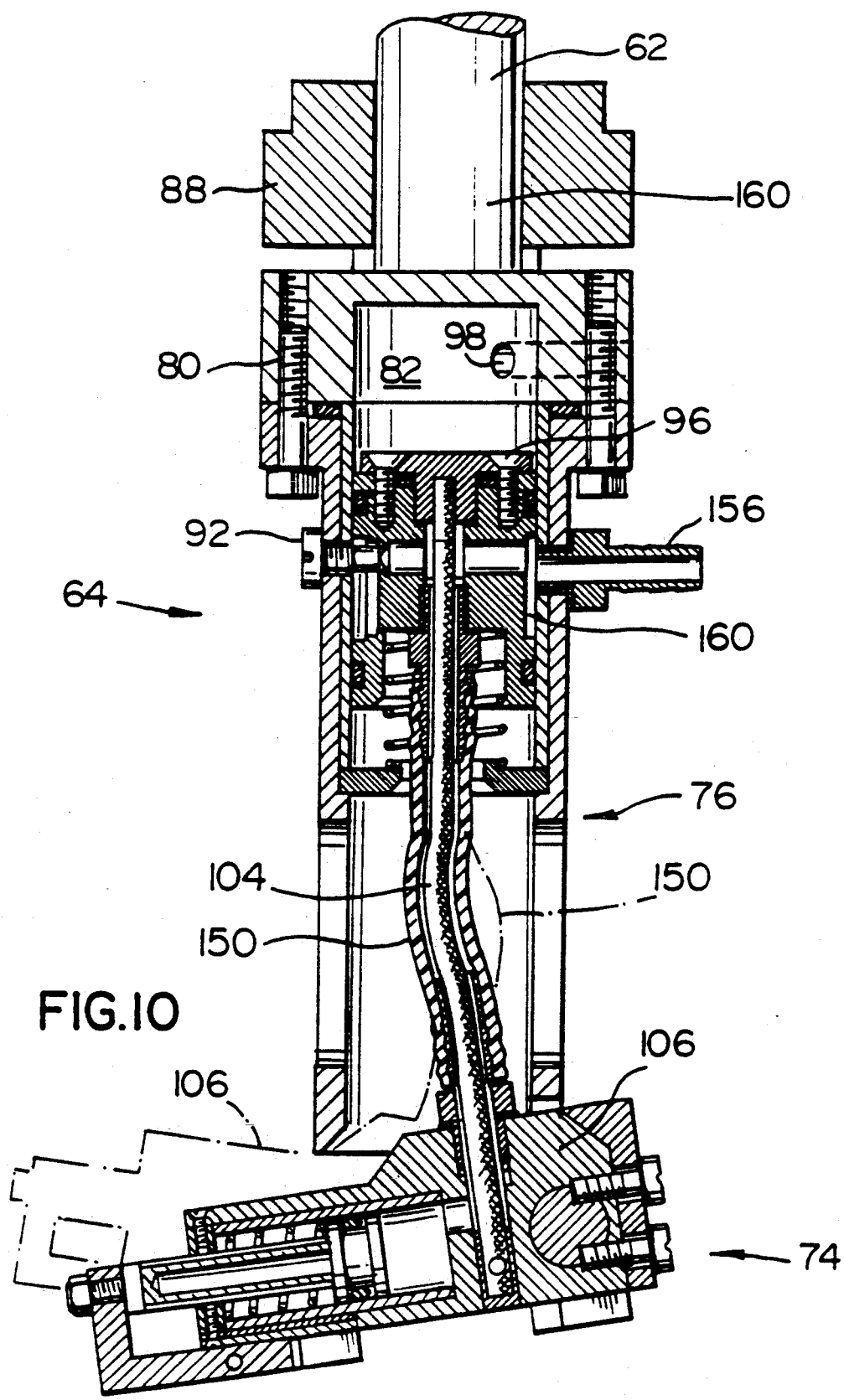

In use, the arm is moved to locate the spindle 62 with the device 64 disposed above a surface mount component 10 in a selected pick-up station 24 of the tray 26. At this time the device 74 is in its upper position within the cylinder 78. This is the position shown by FIG. 7. The piston 96 is then urged downwardly by pressurized air entering the port 98 so that the shaft 104 and the supported metal block 106 is lowered towards the surface component 10 as shown by FIGS. 9 and 14. Upon the metal block 106 moving away from the lower end 86 of the cylinder 78, the surfaces 164 and 166 form a clearance with the surface 162. As the shaft 104 and the sleeve 150 are both flexible then the clearance allows for flexing action of the shaft 104 and sleeve 150 in any vertical plane so as to be able to tilt the metal block 106 at any desired angle. Examples of this are shown in FIG. 10 wherein, in full outline, the shaft 104 and sleeve 150 are shown flexed in one direction to tilt the metal block 106 towards the right while, in chain dotted outline, the shaft and tube are flexed in the opposite direction to tilt a metal block 106 towards the left. It will be understood that tilting in a multitude of other planes transversely to the plane of FIG. 10 is also possible.

Thus, if the component 10 is tilted with its upper surface lying in a non-horizontal position (e.g., in FIG. 14) then, as the metal block 106 engages on its underside with the component 10, the shaft 104 is caused to flex so that the underside of the metal block becomes tilted in accordance with the tilt on the component 10 until the metal block is supported by the component with the upper surface of the component substantially intimately engaging the undersurface of the metal block. This is the position shown by FIG. 15. The piston and cylinder arrangement 140 may then be operated to move the jaw 110 inwards so as to grip the component 10 against the jaw 108. This is the position shown in FIG. 17.

Figure 16:
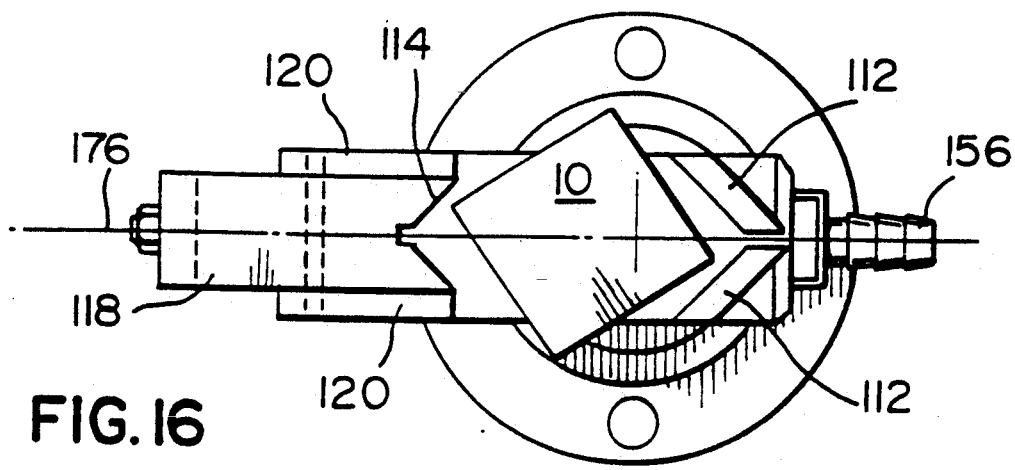
FIG. 16 is a view on arrow XVI in FIG. 15 of the device in use.
Figure 18:
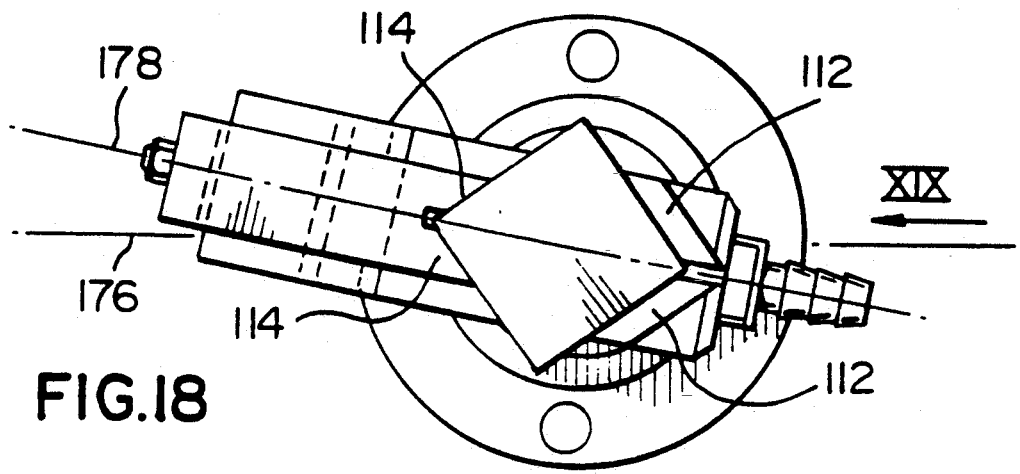
FIG. 18 is a view in the direction of arrow XVIII in FIG. 17.

However, if the component 10 is not in a desired location and position of orientation relative to the axis 160 of the support as shown by FIG. 16, then during closing together of the jaws 108 and 110, the component 10 is urged towards the jaws 108. The component may provide some resistance to movement thereby causing the metal block 106 to rotate around the flexible shaft 104 and thus move out of its original position of orientation relative to the axis 160. This is illustrated in FIG. 18 wherein as shown, with the jaws moved together, the metal block 106 has rotated from its original longitudinal axis position 176 to a new axis position 178 which is angularly displaced around the axis 160 of the support. A comparison of FIG. 18 with either of FIGS. 13 and 16 will make this movement clear. Upon the metal block 106 reaching the position shown in FIG. 18, the projection 172 has rotated from its symmetrical position with regard to the recess 170 as shown by FIG. 11 to a position, shown for example in FIG. 19, in which the projection 172 has moved to the right. Thus, at this stage, the component 10 is spaced from a desired location relative to the support and is also orientated incorrectly with regard to the axis 160.

Figure 21:
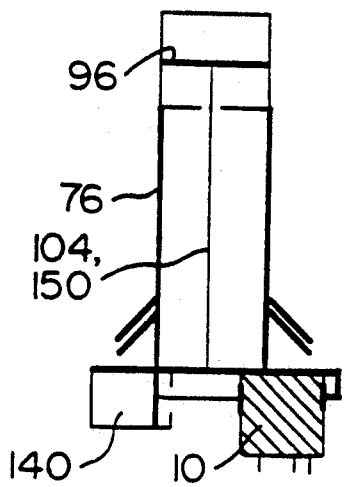

The piston 96 is then returned upwardly in the chamber 82 so as to raise the surface mount component 10. During this movement the metal block approaches the lower end of the cylinder 78 and the right-hand surface 174 in FIGS. 11 and 19 engages the corresponding surface 168. During continued movement, the surface 174 slides on the surface 168 so that the metal block 160 is rotated once more towards the left in FIG. 19 so as to move back to its original axis position 176 shown by FIGS. 13 and 16. During this upward movement also, the cable 104 is straightened under the combined weight of the metal block and the component so that the component is tilted towards a horizontal position as shown by FIG. 20. Towards the termination of the movement, the surfaces 164 and 166 engage the frusto-conical surface 162 thereby drawing the metal block 106 laterally as required so that the lower end of the shaft 104 is coaxial with the piston 96. This action upon the surface 162 is simultaneous with the action of the registration surfaces 168 and 174 so that when seated once again at the lower end of the cylinder 78, the metal block is in its desired location and position of orientation as shown by FIGS. 7, 8 and 21. Thus the component 10 is also in a desired position and angle of orientation relative to the device 64 and its axis 160. It follows that with the article gripping means in the upper position, the desired location and position of orientation of the component 10 are as desired with regard to x and y coordinates within the computer memory.

Figure 22:
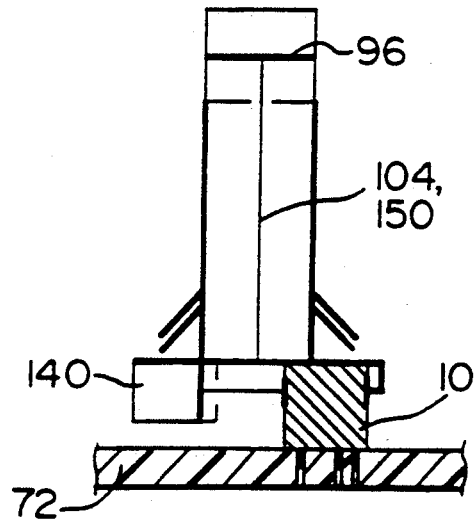

To assemble the component 10 into its assembly station on the printed circuit board, it is merely necessary to have one computer control movement of the arm 52 from the tray 26 to the board 72. Downward movement of the spindle 62 with the article gripping means 74 in the upper position will then accurately locate the component 10 upon the board 72 with terminal pins 172 of the component received within holes of the board. This is as shown by FIG. 22.

As may be seen from the above embodiment, the present invention avoids the necessity of requiring devices, separate from the robot arm 52 and gripper, for orienting and positioning the components 10. Thus, maintenance and repair of such a device is avoided. In the present invention, and as shown by the above-described embodiment, the positioning means and the angle of orientation correction means are employed advantageously in the device 64 itself so as to simplify the total operation.

As described, the shaft 104 may flex in any direction to enable the metal block to lie correctly upon a component 10 which is randomly tilted so as to enable the jaws to grip and raise the component to locate the component in its desired location and position of orientation. In addition to this, the rotational flexibility of the metal block 106 is such that it will rotate sufficiently to enable the jaws to grip a component 10 which is angularly displaced from its correct angle of orientation by up to 20°. This movement entails not only the movement in the direction indicated by FIG. 18 but also rotational movement in the opposite direction so that the projection 172 of the metal block moves towards the left instead of towards the right as in FIG. 19.

What is claimed is:

1. A device for use in positioning an article precisely in a desired location and position of orientation comprising:

an article gripping means and a support for the gripping means, the article gripping means dependent from a flexible shaft means of the support, the article gripping means being provided with a fluid operated piston and cylinder arrangement for relatively moving the jaws, and the flexible shaft means comprises a flexible shaft surrounded by a flexible sleeve to define an annular passage between shaft and sleeve, the annular passage interconnected with the cylinder of the piston and cylinder arrangement for the flow of fluid to control operation of the piston;

the article gripping means having at least two gripping jaws and being movable between an upper position close to the support and a lower position spaced from the support and in which the flexible shaft means is flexible to tilt the article gripping means in any desired direction to enable the article gripping means to engage and then to become inclined according to the inclination of the upper surface of the article so as to enable the jaws, during closing, to correctly engage the article before raising it; and seating means for seating the article gripping means in a desired location and position of orientation relative to a vertical axis of the support upon return of the article gripping means into its upper position whereby the gripping jaws when gripping the article are disposed in desired locations and angles of orientation relative to the vertical axis.

2. A device according to claim 1 wherein the flexible shaft comprises a flexible cable.

3. A device according to claim 1 wherein the support provides a vertically disposed piston and cylinder assembly comprising a cylinder having a vertical axis and defining a chamber, and a piston located within the chamber, the flexible shaft extends between the piston of the piston and cylinder assembly and the article gripping means, and the annular passage is interconnected with a fluid flow passage through the piston of the piston and cylinder assembly for connection to a source of pressurized fluid.

4. A device according to claim 3 wherein the cylinder of the piston and cylinder assembly extends downwardly from the chamber of the piston and cylinder assembly and the seating means comprises at least one arcuate surface on the article gripping means which coacts with an arcuate surface at a lower end of the cylinder of the piston and cylinder assembly as the article gripping means moves into its upper position, each of the arcuate surfaces extending in arcuate form around the vertical axis and, at any section normal to a tangent to the surface, being inclined relative to the vertical axis.

5. A device according to claim 4 wherein the seating means further comprises a pair of opposed registration surfaces formed at the lower end of the cylinder of the piston and cylinder assembly, the registration surfaces spaced from the vertical axis of the cylinder of the piston and cylinder assembly, and another pair of registration surfaces is provided upon the article gripping means, the registration surfaces of at least one of the pairs being inclined relative to the vertical axis of the cylinder with a registration surface of one pair slideable upon a corresponding surface of the other pair as the article gripping means is being moved into the upper position to effect change in horizontal angle of orientation of the gripping means and dispose the gripping jaws in their desired angels of orientation.

6. A device according to claim 5 wherein the pair of registration surfaces formed at the lower end of the cylinder is provided by sides of a recess formed upwardly into the lower end of the cylinder of the piston and cylinder assembly and the pair of registration surfaces provided upon the article gripping means is provided by an upward projection of the article gripping means, which projection is spaced radially from the flexible shaft.

7. A device according to claim 6 wherein the upwardly extending recess in the lower end of the cylinder of the piston and cylinder assembly forms a circumferential interruption in the arcuate surface at the lower end of the cylinder of the piston and cylinder assembly.

8. A device for positioning an article precisely in a desired location and position of orientation comprising:
   an article gripping means and a support for the gripping means,
   the support having means for controllably moving the article gripping means between an upper position close to the support and a lower position spaced from the support, the means for controllably moving including a flexible shaft means by which the article gripping means is dependent from the support,
   wherein in the lower position of the gripping means;
   (a) the flexible shaft means is flexible to tilt the article gripping means in any desire direction in vertical planes; and
   (b) the article gripping means is capable of free horizontal angular orientation around a vertical axis of the support;
   the tilting flexibility and angular orientation capability being provided to enable the article gripping means to engage and then to become inclined according to the inclination of the upper surface of the article, and to orientate according to the horizontal angular orientation of the article, so as to enable the article gripping means, during gripping, to correctly engage the article before raising it;
   and seating means for seating the article gripping means in a desired fixed location relative to the vertical axis and fixed angle of orientation horizontally around the vertical axis upon return of the article gripping means into its upper position whereby the article gripping means when gripping the article are disposed in desired fixed locations and in desired fixed angles of horizontal orientation relative to the vertical axis.

9. A device according to claim 8 wherein, the seating means is capable of effecting correction in angle of orientation of the gripping means after it has moved out of the lower position whereby, with the gripping means seated, the article gripping means when gripping the article are disposed in desired fixed locations and fixed angles of orientation relative to the vertical axis.

10. A device according to claim 9 wherein for correcting a horizontal angle of the orientation of the gripping means, the seating means comprises a pair of registration surfaces provided upon the support and another pair of registration surfaces provided upon the article gripping means, the registration surfaces of at least one of the pairs being inclined relative to the vertical axis with a registration surface of one pair slideable on a corresponding surface of the other pair, as the article gripping means is being moved into the upper position, to effect change in the horizontal angle of orientation of the gripping means and dispose the gripping means in their desired fixed locations and angels of orientation, and with the article gripping means in tis upper position, the one pair of registration surfaces is registered with the other pair.

11. A device according to claim 9 wherein for correcting the horizontal angle of orientation of the gripping means, the seating means comprises a projection provided upon one of the article gripping means and the support and a recess formed upon the other of the article gripping means and the support, the projection having a pair of registration surfaces which converge in an upward direction, the projection moving into the recess with one of the registration surfaces of the projection engaging and sliding upon a corresponding one of a pair of registration surfaces of the recess as the article gripping means is being moved into the upper position to effect change in the horizontal angel of orientation of the gripping means and dispose the gripping means in their desired fixed locations and angels of orientation, and with the article gripping means in its upper position, the pair of registration surfaces of the projection registering with the pair of registration surfaces of the recess.

12. A device according to claim 11 wherein the projection is provided upon the article gripping means and the recess upon the support.

13. A device according to claim 8 wherein the seating means comprises at least one arcuate surface on the article gripping means which coacts with an arcuate surface on the support as the article gripping means moves into its upper position, each of the arcuate surfaces extending in arcuate form around the vertical axis and, at any section normal to a tangent to the surface, being inclined relative to the vertical axis.

14. A device according to claim 13 wherein each arcuate surface comprises the surface of a cone.

15. A device according to claim 13 wherein each arcuate surface is also arcuate in any section normal to a tangent to the surface.

* * * * *

UNITED STATES PATENT AND TRADEMARK OFFICE
CERTIFICATE OF CORRECTION

PATENT NO. : 5,255,948
DATED : October 26, 1993
INVENTOR(S) : Wiercienski et al

It is certified that error appears in the above-identified patent and that said Letters Patent is hereby corrected as shown below:

On the title page, "[73] Assignee: Northern Telecom Limited, Montreal, Canada" should be
--[73] Assignee: The Governing Council of the University of Toronto, Toronto; Northern Telecom Limited, Montreal, both of Canada--

Signed and Sealed this

Tenth Day of May, 1994

Attest:

BRUCE LEHMAN

*Attesting Officer*     Commissioner of Patents and Trademarks